(12) United States Patent
Nakajima et al.

(10) Patent No.: US 10,446,415 B2
(45) Date of Patent: Oct. 15, 2019

(54) EXHAUST METHOD OF HEAT TREATMENT APPARATUS

(71) Applicant: SCREEN Holdings Co., Ltd., Kyoto (JP)

(72) Inventors: Omo Nakajima, Kyoto (JP); Mao Omori, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/007,088

(22) Filed: Jun. 13, 2018

(65) Prior Publication Data

US 2019/0035645 A1    Jan. 31, 2019

(30) Foreign Application Priority Data

Jul. 27, 2017  (JP) ................ 2017-145661

(51) Int. Cl.
*H01L 21/67* (2006.01)
*H01L 21/687* (2006.01)
*H01L 21/28* (2006.01)

(52) U.S. Cl.
CPC .. *H01L 21/67017* (2013.01); *H01L 21/67115* (2013.01); *H01L 21/67248* (2013.01);
(Continued)

(58) Field of Classification Search
CPC ......... H01L 21/67017; H01L 21/67115; H01L 21/67248; H01L 21/67288; H01L 21/6875;
(Continued)

(56) References Cited

U.S. PATENT DOCUMENTS

2012/0043062 A1*  2/2012  Tada ................. H01L 21/67109
                                                                   165/138
2012/0067522 A1*  3/2012  Shimomura ...... H01L 21/67109
                                                                   156/345.32
(Continued)

FOREIGN PATENT DOCUMENTS

JP     2016-127194        7/2016
TW    201243954 A        11/2012
(Continued)

OTHER PUBLICATIONS

Office Action and Search Report for counterpart Taiwanese Application No. 107119135 dated Mar. 7, 2019 and English translation of Search Report.

*Primary Examiner* — Shahed Ahmed
(74) *Attorney, Agent, or Firm* — Ostrolenk Faber LLP

(57) ABSTRACT

In a state where an ammonia atmosphere is formed in a chamber for housing a semiconductor wafer, heating treatment is applied to the semiconductor wafer by emitting a flash of light to a front surface of the substrate using a flash lamp. When the semiconductor wafer cracks during flash heating, supplying gas into the chamber as well as exhausting gas therefrom is temporarily stopped. Then, gas in the chamber is exhausted at an exhaust flow rate smaller than a steady exhaust flow rate. The steady exhaust flow rate is an exhaust flow rate when heating treatment is applied to a semiconductor wafer. This enables ammonia in the chamber to be discharged by exhausting gas in the chamber while preventing fragments of the semiconductor wafer from being caught in the vacuum pump.

6 Claims, 10 Drawing Sheets

(52) U.S. Cl.
CPC .... *H01L 21/67288* (2013.01); *H01L 21/6875* (2013.01); *H01L 21/28185* (2013.01)

(58) Field of Classification Search
CPC ........... H01L 21/28185; H01L 21/2636; H01L 2021/60165; H01L 2021/60105–60127; H01L 51/0027; H01L 2924/3512; B08B 7/0035; B08B 7/04; B08B 5/00
See application file for complete search history.

(56) References Cited

U.S. PATENT DOCUMENTS

| | | | |
|---|---|---|---|
| 2012/0244725 A1* | 9/2012 | Fuse | H01L 21/26513 438/799 |
| 2013/0037534 A1 | 2/2013 | Yoshii et al. | 219/494 |
| 2013/0065189 A1 | 3/2013 | Yoshii et al. | 432/9 |
| 2013/0078822 A1* | 3/2013 | Yokouchi | H01L 21/67115 438/795 |
| 2014/0169772 A1 | 6/2014 | Abe et al. | 392/418 |
| 2014/0329340 A1* | 11/2014 | Yokouchi | H01L 21/265 438/10 |
| 2016/0195333 A1 | 7/2016 | Kawarazaki | |
| 2018/0076061 A1 | 3/2018 | Fuse | 438/560 |

FOREIGN PATENT DOCUMENTS

| | | |
|---|---|---|
| TW | 201333656 A | 8/2013 |
| TW | 201342473 A | 10/2013 |
| TW | 201430913 A | 8/2014 |
| WO | WO 2016/151937 A1 | 9/2016 |

\* cited by examiner

F I G . 4
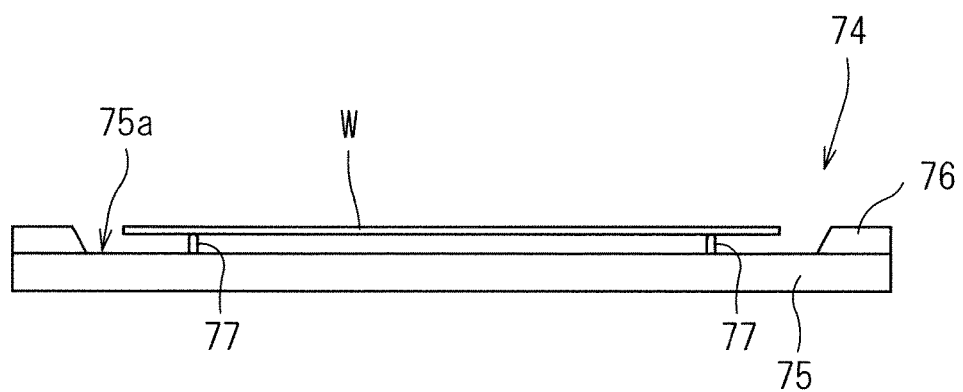

F I G . 5
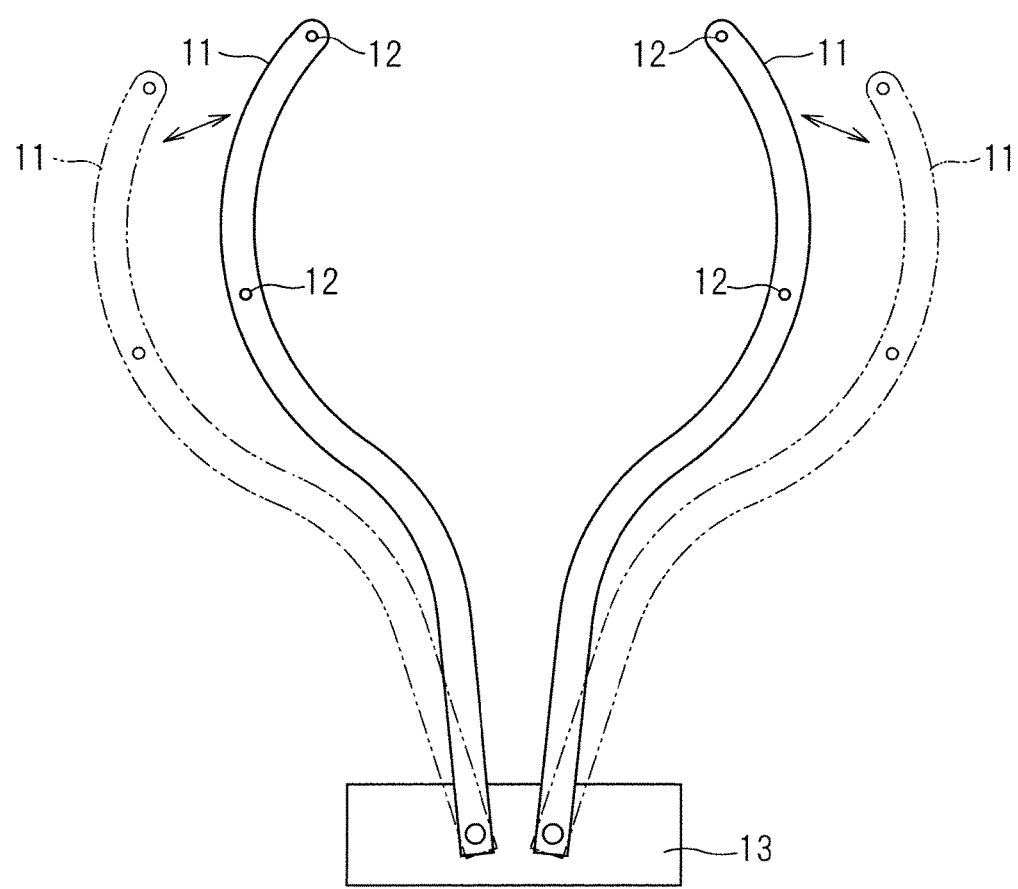

EXHAUST METHOD OF HEAT TREATMENT APPARATUS

BACKGROUND OF THE INVENTION

Field of the Invention

The present invention relates to an exhaust method of a heat treatment apparatus that applies heating treatment to a thin-plated precision electronic substrate (hereinafter referred to as simply "substrate") such as a semiconductor wafer in a chamber, the exhaust method being used when the substrate cracks in the heat treatment apparatus.

Description of the Background Art

In a manufacturing process of semiconductor devices, flash lamp annealing (FLA) for heating a semiconductor wafer for an extremely short time has been paid attention. The flash lamp annealing is a heat treatment technology for irradiating a front surface of a semiconductor wafer with a flash of light by using a xenon flash lamp (hereinafter when referred to as simply a "flash lamp", it means a xenon flash lamp) to increase temperature of only the front surface of the semiconductor wafer in an extremely short time (milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the front surface of the semiconductor wafer.

This kind of flash lamp annealing is used for treatment requiring heating for an extremely short time, such as typically activation of impurities implanted into a semiconductor wafer. When a flash lamp irradiates a surface of a semiconductor wafer, into which impurities are implanted by an ion implantation method, with a flash of light, temperature of the front surface of the semiconductor wafer can be increased to an activation temperature for only an extremely short time, whereby only impurity activation can be performed without diffusing the impurities deeply.

Meanwhile, the flash lamp annealing has been attempted to be performed in an atmosphere of a reactive gas such as ammonia. For example, US2016/0195333 also discloses that an ammonia atmosphere is formed by supplying a mixed gas of ammonia and nitrogen into a chamber in which heating treatment is performed, and a substrate provided with a high dielectric constant gate insulating film is heated by being irradiated with a flash of light in the ammonia atmosphere to cause the high dielectric constant gate insulating film to be subjected to nitriding treatment. The high dielectric constant gate insulating film (high-k film) is developed as a new stack structure of a field effect transistor together with a metal gate electrode using a metal for the gate electrode to solve a problem that leakage current increases with progress of thinning of a gate insulating film.

The flash lamp annealing causes temperature of a front surface of a semiconductor wafer to rise in an extremely short time by irradiating the surface with a flash light having a very short irradiation time and strong energy, so that the semiconductor wafer may crack in a chamber due to sudden thermal expansion only near the front surface. When the semiconductor wafer cracks, it is necessary to open the chamber and recover fragments of the broken semiconductor wafer to clean the inside of the chamber.

However, when an atmosphere of a reactive gas such as ammonia is formed in the chamber, opening the chamber as-is causes the harmful reactive gas to be discharged into a clean room. Thus, the chamber needs to be opened after the atmosphere of the reactive gas in the chamber is temporarily exhausted by using a vacuum pump or the like to replace the atmosphere in the chamber with an atmosphere of an inert gas such as nitrogen.

Unfortunately, exhausting gas in the chamber having fragments of a broken semiconductor wafer therein may cause a problem that the fragments are caught into the vacuum pump to cause failure of the vacuum pump.

SUMMARY OF THE INVENTION

The present invention is directed to an exhaust method of a heat treatment apparatus that applies heating treatment to a substrate in a chamber.

According to an aspect of the present invention, an exhaust method of a heat treatment apparatus includes the following steps of: (a) supplying a predetermined treatment gas into a chamber housing a substrate to apply heating treatment to the substrate while a vacuum pump exhausts gas from the chamber at a first exhaust flow rate; (b) stopping supply of the treatment gas into the chamber and exhaust from the chamber, when a crack in the substrate during the heating treatment in the chamber is detected; (c) reducing pressure in the chamber after the step (b) by exhausting gas from the chamber at a second exhaust flow rate smaller than the first exhaust flow rate by using the vacuum pump; and (d) supplying an inert gas into the chamber to restore the pressure in the chamber to atmospheric pressure after the pressure in the chamber is reduced to a predetermined pressure.

This causes no strong exhaust flow to be formed in the chamber, so that gas in the chamber can be exhausted while fragments of the substrate are prevented from being caught into the vacuum pump.

It is preferable that the exhaust flow rate from the chamber be increased within a range smaller than the first exhaust flow rate, in the step (c).

This enables gas in the chamber to be quickly exhausted.

It is preferable that a filter be provided in an exhaust line communicatively connecting the vacuum pump and the chamber.

This causes fragments of the substrate slightly drawn into the exhaust line to be removed by the filter, so that the fragments are reliably prevented from being caught into the vacuum pump.

Thus, it is an object of the present invention to enable gas in a chamber to be exhausted while preventing fragments of a substrate from being caught into a vacuum pump even when the substrate cracks in the chamber.

These and other objects, features, aspects and advantages of the present invention will become more apparent from the following detailed description of the present invention when taken in conjunction with the accompanying drawings.

BRIEF DESCRIPTION OF THE DRAWING

FIG. 4 is a sectional view of the susceptor;
FIG. 5 is a plan view of a transfer mechanism.

DESCRIPTION OF THE PREFERRED EMBODIMENTS

Preferred embodiments according to the present invention will now be described in detail with reference to the drawings.

Figure 1:
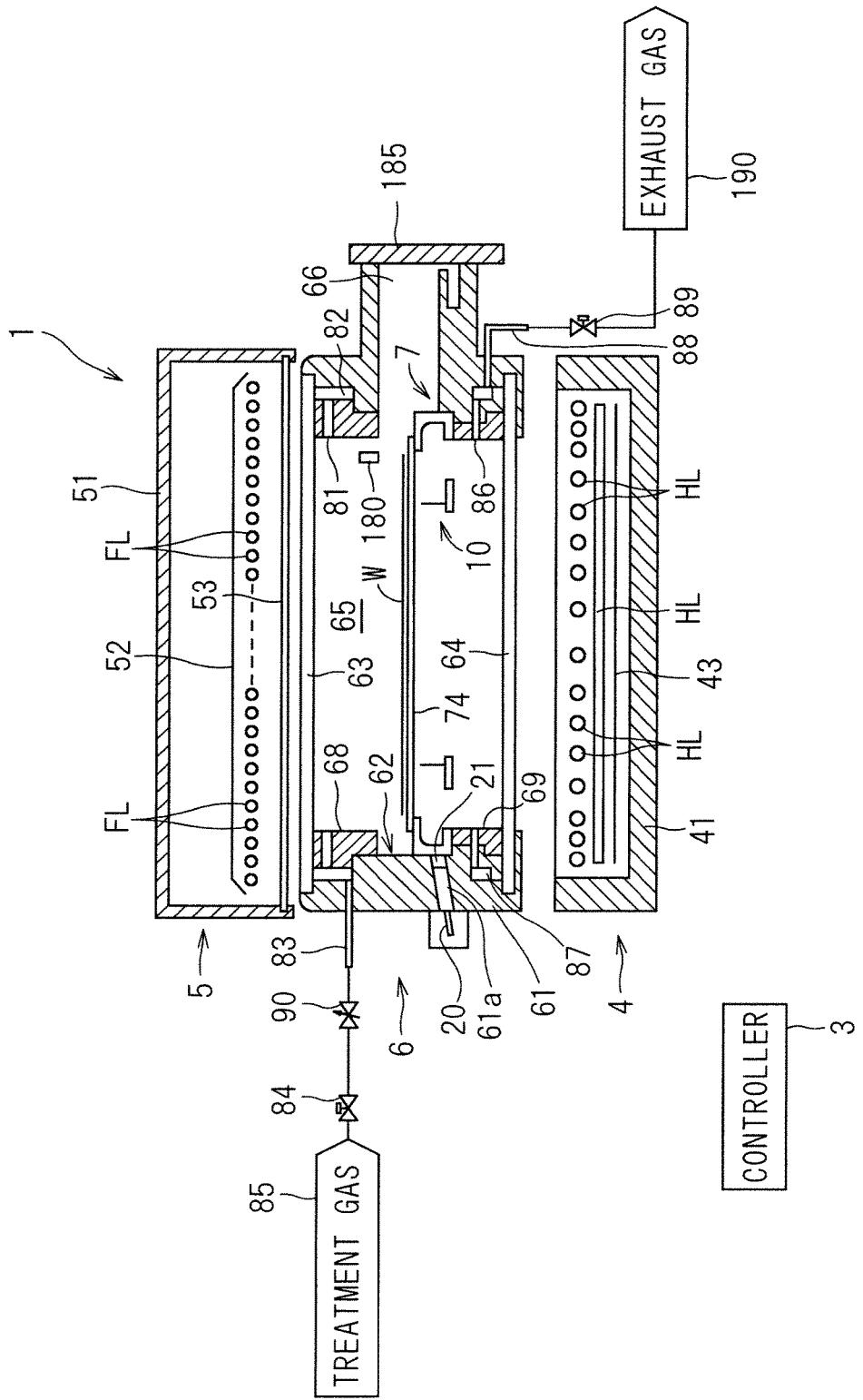
FIG. 1 is a longitudinal sectional view showing a structure of a heat treatment apparatus.

First, a configuration of a heat treatment apparatus as an object of an exhaust method according to the present invention will be described. FIG. 1 is a longitudinal sectional view showing a structure of a heat treatment apparatus 1. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). The semiconductor wafer W before being transported into the heat treatment apparatus 1 is provided with a high dielectric constant film (high-k film) as a gate insulating film, and post deposition anneal (PDA) is applied to the high dielectric constant film by heating treatment by the heat treatment apparatus 1. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a bored therein. A radiation thermometer 20 is mounted to a location of an outer wall surface of the chamber side portion 61 where the through hole 61a is provided. The through hole 61a is a cylindrical hole for directing infrared radiation emitted from the lower surface of a semiconductor wafer W held by a susceptor 74 to be described later therethrough to the radiation thermometer 20. The through hole 61a is inclined with respect to a horizontal direction so that a longitudinal axis (an axis extending in a direction in which the through hole 61a extends through the chamber side portion 61) of the through hole 61a intersects a main surface of the semiconductor wafer W held by the susceptor 74. A transparent window 21 made of barium fluoride material transparent to infrared radiation in a wavelength range measurable with the radiation thermometer 20 is mounted to an end portion of the through hole 61a which faces the heat treatment space 65.

At least one gas supply opening 81 for supplying a treatment gas (nitrogen gas ($N_2$) and ammonia ($NH_3$) in the present preferred embodiment) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. The treatment gas supply source 85 feeds nitrogen gas, or a mixed gas of ammonia and nitrogen gas, as a treatment gas to the gas supply pipe 83 under control of the controller 3. A supply valve 84 and a flow control valve 90 are provided at some midpoint in the gas supply pipe 83. When the supply valve 84 is opened, the treatment gas is fed from the treatment gas supply source 85 to the buffer space 82. The flow control valve 90 adjusts a flow rate of the treatment gas flowing through the gas supply pipe 83 to be fed into the buffer space 82. The flow rate of the treatment gas defined by the flow control valve 90 is variable under control of the controller 3. The treatment gas flowing in the buffer space 82 flows in a spreading manner within the buffer space 82 which is lower in fluid resistance than the gas supply opening 81, and is supplied through the gas supply opening 81 into the heat treatment space 65. The treatment gas is not limited to nitrogen gas and ammonia, and may be an inert gas such as argon (Ar) and helium (He), or a reactive gas such as oxygen ($O_2$), hydrogen ($H_2$), chlorine ($Cl_2$), hydrogen chloride (HCl), ozone ($O_3$), nitric oxide (NO), nitrous oxide ($N_2O$), and nitrogen dioxide ($NO_2$).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. An exhaust valve 89 is inserted at some midpoint in the gas exhaust pipe 88. When the exhaust valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

Figure 8:
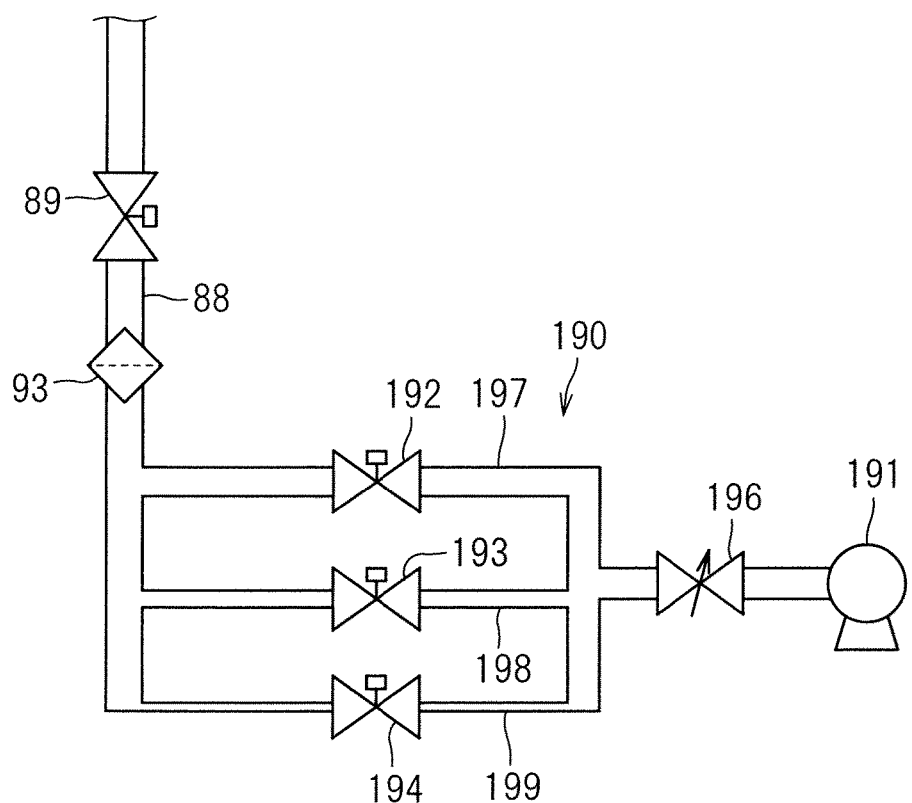
FIG. 8 is a diagram showing a configuration of an exhaust part.

FIG. 8 is a diagram showing a configuration of the exhaust part 190. The exhaust part 190 includes a vacuum pump 191, a flow control valve 196, three bypass lines 197, 198, and 199, and three exhaust valves 192, 193, and 194. The gas exhaust pipe 88 branches into the three bypass lines 197, 198, and 199. The gas exhaust pipe 88, and the three bypass lines 197, 198, and 199, constitute an exhaust line for guiding the exhaust gas from the chamber 6. The chamber 6 and the vacuum pump 191 are communicatively connected through the gas exhaust pipe 88, and the three bypass lines 197, 198, and 199. The three bypass lines 197, 198, and 199 are provided in parallel. The three bypass lines 197, 198, and 199 each have a different pipe diameter. The bypass line 199 has the smallest diameter that is a quarter of that of the gas exhaust pipe 88, for example. Meanwhile, the bypass line 197 has the largest diameter that is the same as that of the gas exhaust pipe 88, for example. The bypass line 198 has a diameter between the largest and smallest diameters, being three-eighths of that of the gas exhaust pipe 88, for example. Thus, a flow rate of gas that can pass decreases in the order of the bypass lines 197, 198, and 199.

The three exhaust valves 192, 193, and 194 are provided in three bypass lines 197, 198, and 199, respectively. That is, the exhaust valve 192 is provided in the bypass line 197 largest in diameter, the exhaust valve 193 is provided in the bypass line 198 intermediate in diameter, and the exhaust valve 194 is provided in the bypass line 199 smallest in diameter. When the three exhaust valves 192, 193, and 194 are opened with the vacuum pump 191 operated, the exhaust gas from the chamber 6 guided by the gas exhaust pipe 88 passes through the corresponding bypass lines 197, 198, and 199 to be sucked into the vacuum pump 191.

The three bypass lines 197, 198, and 199 each have a different pipe diameter, and thus are different in exhaust capability. The exhaust capability increases with increase in pipe diameter, so that the bypass lines 199, 198, and 197 increases in exhaust capability in the order listed above. This enables an exhaust flow rate from the chamber 6 to be controlled by opening and closing any one of the three exhaust valves 192, 193, and 194. Any one of the three exhaust valves 192, 193, and 194 may be opened, or two or three of them may be opened. For example, when the exhaust valves 192 and 193 are closed and only the exhaust valve 194 is opened, gas is exhausted at the smallest exhaust flow rate. When all the three exhaust valves 192, 193, and 194 are opened, gas is exhausted at the largest exhaust flow rate. That is, the exhaust flow rate from the chamber 6 can be adjusted by opening and closing each of the three bypass lines 197, 198, and 199.

The flow control valve 196 is provided between the confluence of the three bypass lines 197, 198, and 199, and the exhaust pump 191. The flow control valve 196 also can adjust an exhaust flow rate through the exhaust line from the chamber 6. The exhaust flow rate defined by the flow control valve 196 is variable under control of the controller 3. While the three bypass lines 197, 198, and 199 constitute a mechanism for discontinuously adjusting the exhaust flow rate in multiple stages, the flow control valve 196 can be said to be a mechanism for continuously adjusting the exhaust flow rate steplessly.

The gas exhaust pipe 88 is provided with a filter 93. The filter 93 removes relatively large dust and the like from an exhaust flow flowing through the gas exhaust pipe 88.

The gas supply pipe 83, the gas exhaust pipe 88, and the three bypass lines 197, 198, and 199, are each made of stainless steel excellent in strength and corrosion resistance. The chamber 6 is also provided with a pressure gauge 180 for measuring pressure in the heat treatment space 65.

Figure 2:
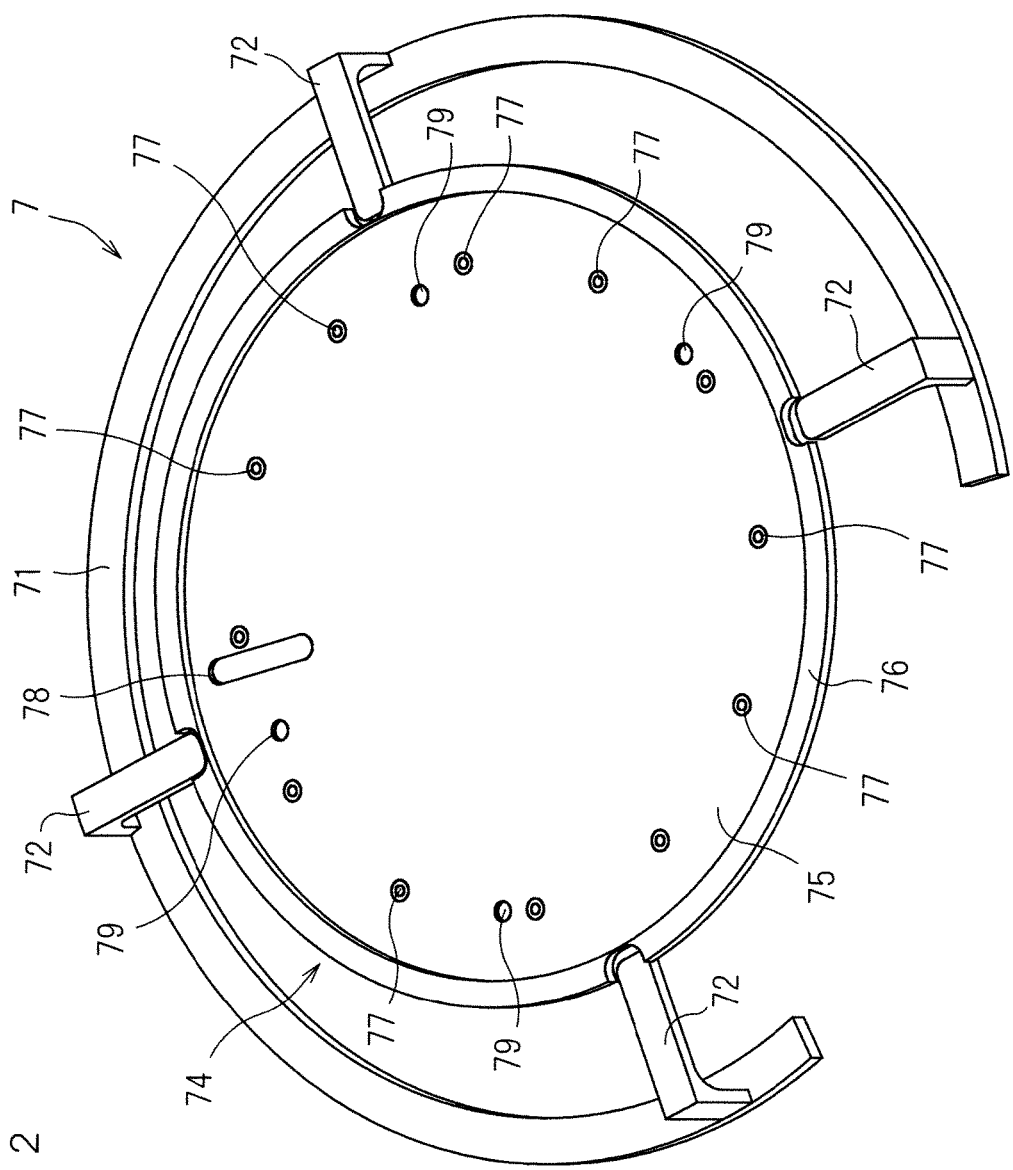
FIG. 2 is a perspective view showing an entire external appearance of a holder.

FIG. 2 is a perspective view showing an entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
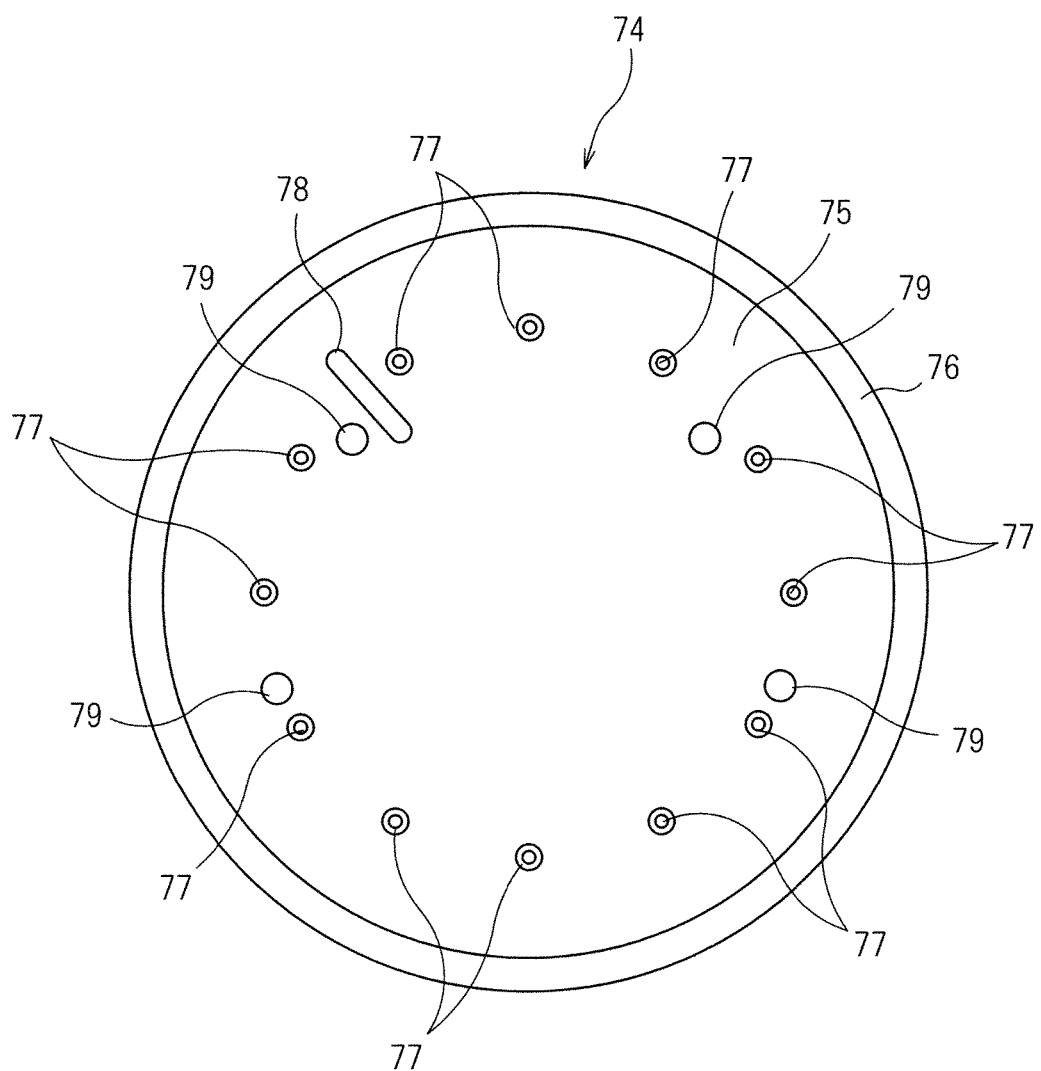
FIG. 3 is a plan view of a susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for the radiation thermometer 20 to receive radiation (infrared radiation) emitted from the lower surface of the semiconductor wafer W. Specifically, the radiation thermometer 20 receives the radiation emitted from the lower surface of the semiconductor wafer W through the opening 78 and the transparent window 21 mounted to the through hole 61a in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 6:
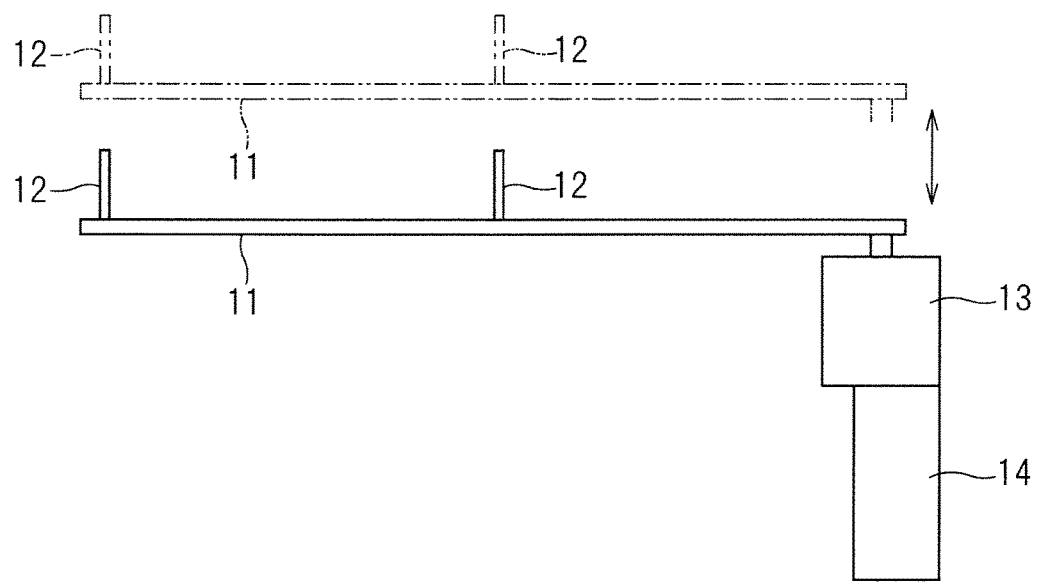
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. A region in which the flash lamps FL are arranged has a size, as seen in plan view, greater than that of the semiconductor wafer W.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

Figure 7:
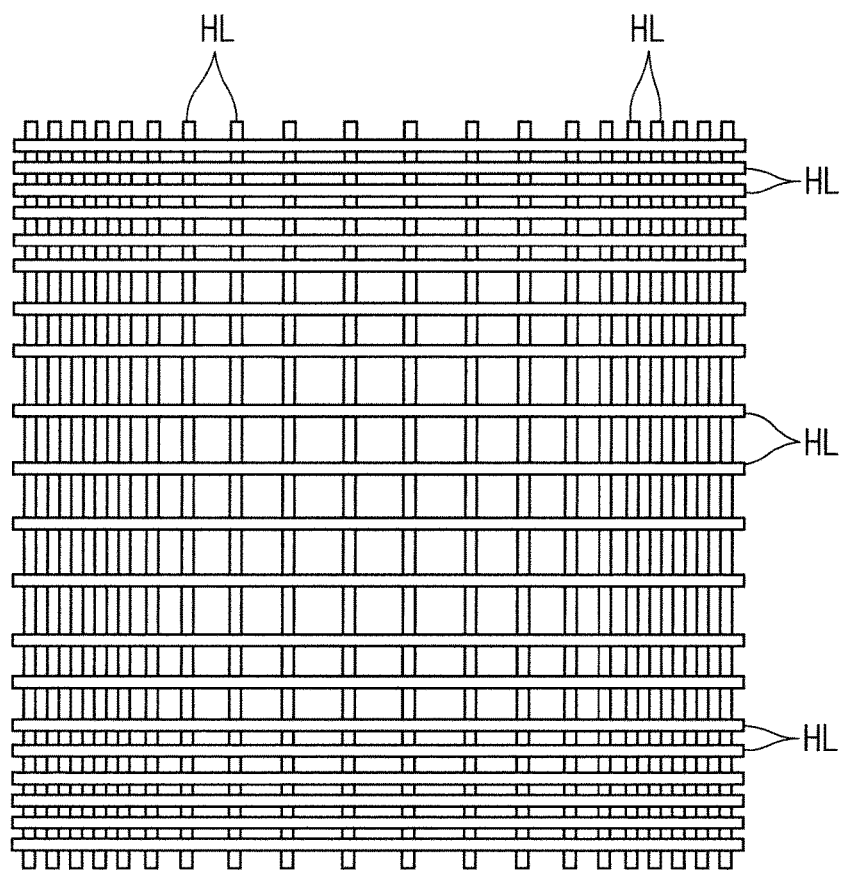
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. The controller 3 controls the supply valve 84, the exhaust valve 89, the flow control valve 90, the flow control valve 196, the vacuum pump 191, and the three exhaust valves 192, 193, and 194 to adjust pressure in the heat treatment space 65, a charge flow rate, and an exhaust flow rate, in the chamber 6.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. Here, the semiconductor wafer W to be treated is a silicon semiconductor substrate having a high dielectric constant film formed as a gate insulating film. The high dielectric constant film is deposited and formed on the front surface of the semiconductor wafer W by a method such as atomic layer deposition (ALD) or metal organic chemical vapor deposition (MOCVD), for example. The heat treatment apparatus 1 emits a flash of light to the semiconductor wafer W in an ammonia atmosphere to perform post deposition anneal (PDA), thereby eliminating defects in the high dielectric constant film after the film is formed. The procedure for the treatment in the heat treatment apparatus 1 which will be described below proceeds under the control of the controller 3 over the operating mechanisms of the heat treatment apparatus 1.

First, the semiconductor wafer W on which the high dielectric constant film is formed is transported into the chamber 6 of the heat treatment apparatus 1. To transport the semiconductor wafer W, the gate valve 185 is opened to open the transport opening 66, and the transport robot outside the apparatus transports the semiconductor wafer W on which the high dielectric constant film is formed into the heat treatment space 65 in the chamber 6 through the transport opening 66. At this time, both the inside and the outside of the chamber 6 are under atmospheric pressure, so that an atmosphere outside the apparatus enters the heat treatment space 65 in the chamber 6 with transport of the semiconductor wafer W. Thus, the amount of the atmosphere outside the apparatus, flowing into the chamber 6, may be suppressed to a minimum by continuously supplying nitrogen gas into the chamber 6 from the treatment gas supply source 85 by opening the supply valve 84 to cause a flow of the nitrogen gas to flow out from the transport opening 66. When the gate valve 185 is opened, it is preferable to close the exhaust valve 89 to stop exhaust from the chamber 6. This causes the nitrogen gas supplied into the chamber 6 to flow out only from the transport opening 66, so that an inflow of external atmosphere can be more effectively prevented.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the susceptor 74 such that its front surface provided with the high dielectric constant film faces upward. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is housed in the chamber 6 and the transport opening 66 is closed by the gate valve 185, the inside of the chamber 6 is depressurized to a pressure lower than the atmospheric pressure. Specifically, the transport opening 66 is closed, so that the heat treatment space 65 in the chamber 6 becomes an enclosed space. In this state, the exhaust valve 89 is opened while the supply valve 84 for supplying gas is closed. The controller 3 opens the exhaust valve 194 provided in the bypass line 199 having the smallest pipe diameter among the three bypass lines 197, 198, and 199 while causing the vacuum pump 191 to operate. The other exhaust valves 192 and 193 are closed. This causes the chamber 6 to be exhausted without gas supply to depressurize the heat treatment space 65 in the chamber 6.

Subsequently, when the inside of the chamber 6 is depressurized to a predetermined pressure, the controller 3 opens all the three exhaust valves 192, 193, and 194. This increases the exhaust flow rate from the chamber 6 to also increase pumping speed. That is, exhaust is performed at a small exhaust flow rate in an initial stage of depressurization, and then the exhaust flow rate is switched to a larger exhaust flow rate to perform the exhaust. Rapid exhaust at a large exhaust flow rate from the start of depressurization causes a large airflow change in the chamber 6, so that particles adhering to the structure (e.g., the lower chamber window 64) in the chamber 6 may be swirled up to adhere again to the semiconductor wafer W, thereby contaminating the semiconductor wafer W. When exhaust is gently performed at a small exhaust flow rate in an initial stage of depressurization, and then the exhaust flow rate is switched to a larger exhaust flow rate to perform the exhaust, swirling up of particles in the chamber 6, as described above, can be prevented. In the present preferred embodiment, a flow rate through the flow control valve 196 is constant.

Next, while the exhaust valve 89, and the exhaust valves 192, 193, and 194, are opened, a mixed gas of ammonia and nitrogen gas as dilution gas is supplied from the treatment gas supply source 85 to the heat treatment space 65 in the chamber 6. As a result, an ammonia atmosphere is formed around the semiconductor wafer W held in the holding part 7 in the chamber 6 under reduced pressure. The concentration of ammonia in the ammonia atmosphere (or, a mixing ratio of ammonia and nitrogen gas) is not particularly limited, and may be an appropriate value such as 10 vol. % or less (about 2.5 vol. % in the present preferred embodiment), for example.

Subsequently, the 40 halogen lamps HL of the halogen heating part 4 are turned on all at once to start preliminary heating (assist heating) of the semiconductor wafer W. Halogen light emitted from the halogen lamps HL is transmitted through the lower chamber window 64 and the susceptor 74 both made of quartz, and impinges upon the lower surface of the semiconductor wafer W. By receiving halogen light irradiation from the halogen lamps HL, the semiconductor wafer W is subjected to assist heating, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the assist heating. Specifically, the radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined assist heating temperature T1 or not. In other words, the controller 3 effects feedback control of the output from the halogen lamps HL so that the temperature of the semiconductor wafer W is equal to the assist heating temperature T1, based on the value measured with the radiation thermometer 20. The assist heating temperature T1 is 300° C. or more and 600° C. or less, and is 450° C. in the present preferred embodiment.

After the temperature of the semiconductor wafer W reaches the assist heating temperature T1, the controller 3 maintains the temperature of the semiconductor wafer W at the assist heating temperature T1 for a short time. Specifically, at the point in time when the temperature of the semiconductor wafer W measured with the radiation thermometer 20 reaches the assist heating temperature T1, the controller 3 adjusts the output from the halogen lamps HL to maintain the temperature of the semiconductor wafer W at approximately the assist heating temperature T1.

By performing such assist heating using the halogen lamps HL, the temperature of the entire semiconductor wafer W is uniformly increased to the assist heating temperature T1. In the stage of the assist heating using the halogen lamps HL, while the semiconductor wafer W shows a tendency to be lower in temperature in a peripheral portion thereof where heat dissipation is liable to occur than in a central portion thereof, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of assist heating.

The flash lamps FL in the flash heating part 5 irradiate the front surface of the semiconductor wafer W held by the susceptor 74 with a flash of light at the time when a predetermined time period has elapsed since the temperature of the semiconductor wafer W reached the assist heating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface of the semiconductor wafer W, provided with a high dielectric constant film, is irradiated with a flash of light from the flash lamps FL to be instantaneously raised in temperature to the treatment temperature T2, thereby performing the post deposition anneal. The flash irradiation can increase the temperature of the front surface of the semiconductor W to the treatment temperature T2 being the maximum temperature (peak temperature) in a region from 600° C. or more to 1200° C. or less (in the present preferred embodiment, 1000° C.).

When the post deposition anneal is performed by raising the temperature of the front surface of the semiconductor wafer W to the treatment temperature T2 in an ammonia atmosphere, nitriding of the high dielectric constant film is promoted to eliminate defects, such as point defects, in the high dielectric constant film. Irradiation time with the flash lamps FL is a short time of about 0.1 milliseconds or more and 100 milliseconds or less, so that time required for the front surface temperature of the semiconductor wafer W to increase from the assist heating temperature T1 to the treatment temperature T2 is also extremely short time of less than one second. The front surface temperature of the semiconductor wafer W immediately after the flash light irradiation falls rapidly from the treatment temperature T2.

After the flash heating treatment is finished, the supply valve 84 is closed to reduce pressure in the chamber 6 again. This enables harmful ammonia to be discharged from the heat treatment space 65 in the chamber 6. Subsequently, the exhaust valve 89 is closed to open the supply valve 84 for supplying gas, so that nitrogen gas is supplied into the chamber 6 from the treatment gas supply source 85 to restore pressure in the chamber 6 to normal pressure (atmospheric pressure). The halogen lamp HL is also turned off to reduce the temperature of the semiconductor wafer W from the assist heating temperature T1. The radiation thermometer 20 measures the temperature of the semiconductor wafer W which is on the decrease. The result of measurement is transmitted to the controller 3. The controller 3 monitors whether or not the temperature of the semiconductor wafer W decreases to a predetermined temperature on the basis of the result of measurement. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

As described above, the flash heating causes temperature of a front surface of a semiconductor wafer W to rise in an extremely short time by irradiating the front surface with a flash light having a very short irradiation time and strong energy, so that the semiconductor wafer W may crack in the chamber 6 due to sudden thermal expansion only near the front surface. When the semiconductor wafer W cracks during the flash heating, it is necessary to recover fragments of the broken semiconductor wafer W by opening the chamber 6 after harmful ammonia in the chamber 6 is discharged and replaced with nitrogen atmosphere. A supply and exhaust process for the chamber 6 when the semiconductor wafer W cracks in the chamber 6 during flash heating will be continuously described below.

Figure 9:
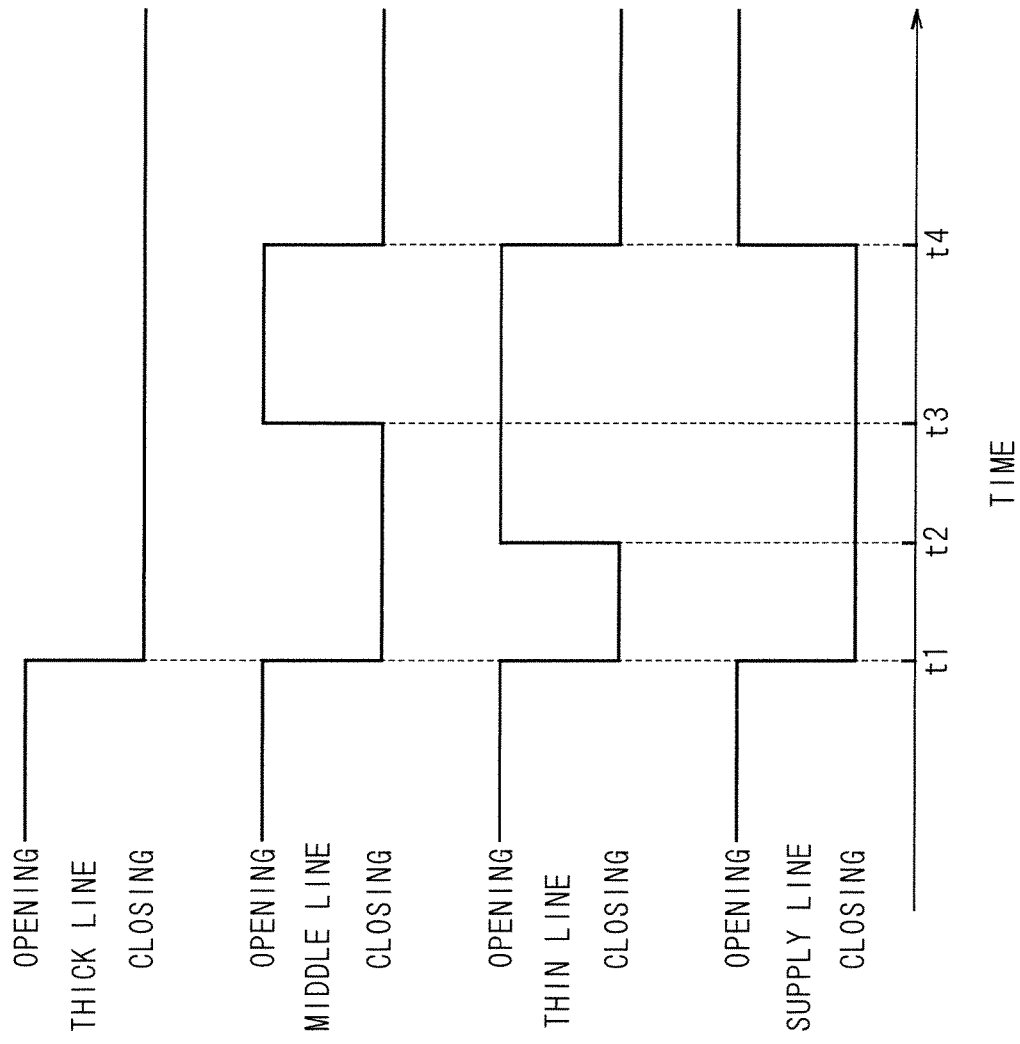
FIG. 9 is a timing chart showing supplying gas into the chamber and exhausting gas therefrom, after a wafer cracks.
Figure 10:
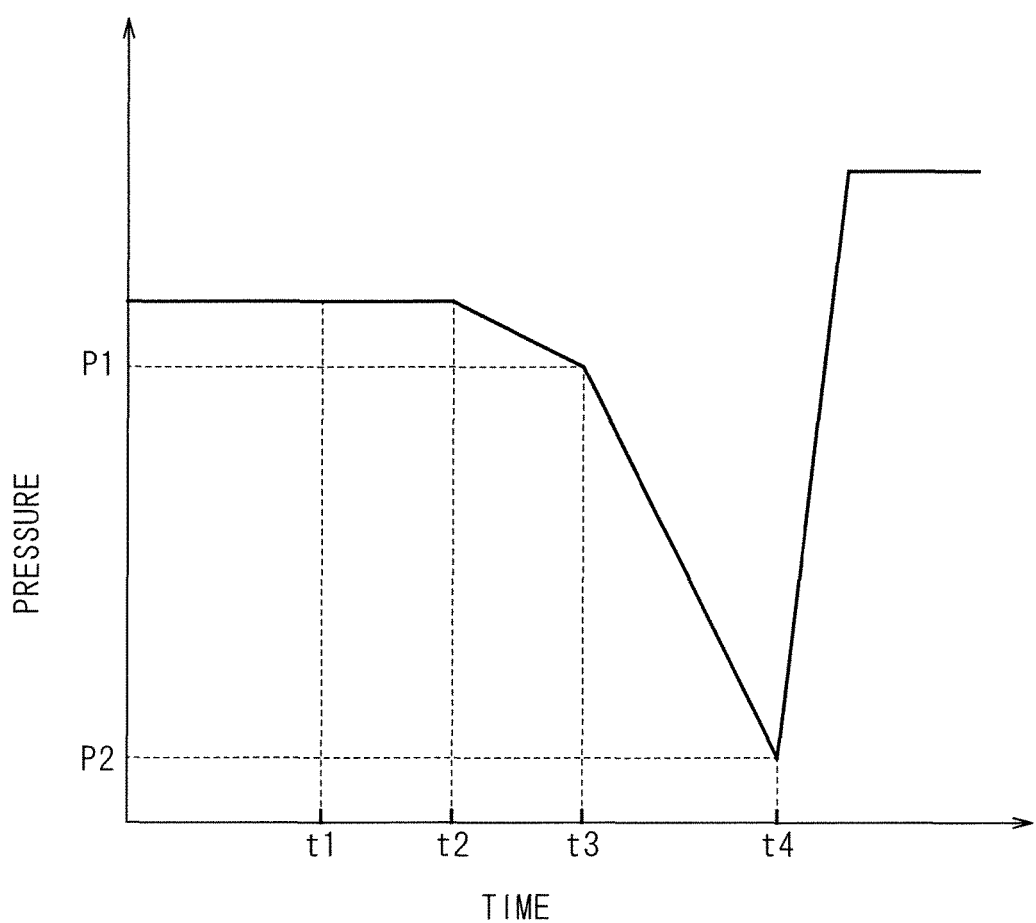
FIG. 10 is a graph showing a pressure change in a chamber after a wafer cracks.

FIG. 9 is a timing chart showing supplying gas into the chamber 6 and exhausting gas therefrom, after a wafer cracks. FIG. 10 is a graph showing a pressure change in a chamber after a wafer cracks. The opening and closing of the "thick line", the "middle line", and the "thin line", shown in FIG. 9, indicate open and closed states of the exhaust valves 192, 193, and 194 provided in the bypass lines 197, 198, and 199, respectively. In other words, when the thick line is opened, the exhaust valve 192 provided in the bypass line 197 largest in diameter is opened. Likewise, when the middle line is opened, the exhaust valve 193 provided in the bypass line 198 intermediate in diameter is opened, and when the thin line is opened, the exhaust valve 194 provided in the bypass line 199 smallest in diameter is opened. The opening or closing of the "supply line" shown in FIG. 9 indicates an opening-closing state of the supply valve 84 provided in the gas supply pipe 83.

When heating treatment is applied to the semiconductor wafer W housed in the chamber 6 of the heat treatment apparatus 1, the supply line (gas supply pipe 83) is opened to supply a treatment gas (mixed gas of ammonia and nitrogen gas) into the chamber 6 and all of the thick line (bypass line 197), the middle line (bypass line 198), and the thin line (bypass line 199) are opened to exhaust gas from the chamber 6 by using the vacuum pump 191. That is, while the heating treatment is applied to the semiconductor wafer W, all of the thick line, the middle line, and the thin line are opened to exhaust gas from the chamber 6 at the maximum exhaust flow rate. Hereinafter, the exhaust flow rate from the chamber 6 when all of the thick line, the middle line, and the thin line are opened while the heating treatment is applied to the semiconductor wafer W is referred to as a "steady exhaust flow rate (first exhaust flow rate)".

It is assumed that a front surface of the semiconductor wafer W is irradiated with a flash of light from the flash lamp FL to be instantaneously raised in temperature and to suddenly expand thermally to cause the semiconductor wafer W to crack at time t1. Cracking of the semiconductor wafer W is detected by a crack detection sensor provided in the heat treatment apparatus 1. As the crack detection sensor, the radiation thermometer 20 can be used, for example. Specifically, while heat conduction from the front surface of the semiconductor wafer W, rapidly raised in temperature immediately after irradiation of a flash of light, causes the back surface thereof to slightly rise in temperature, the radiation thermometer 20 cannot detect such a temperature rise when the semiconductor wafer W cracks. Thus, when a measured temperature value of the radiation thermometer 20 does not increase immediately after the irradiation of the flash of light, the controller 3 determines that wafer cracking has occurred. The crack detection sensor is not limited to the radiation thermometer 20, and other means may be used.

When cracking of the semiconductor wafer W is detected at time t1, the controller 3 immediately stops the heating treatment in the heat treatment apparatus 1 and closes all of the thick line, the middle line, the thin line, and the supply line. This caused gas supply to the chamber 6 as well as exhaust from the chamber 6 to be stopped, so that an ammonia atmosphere is confined in the chamber 6 together with fragments of the semiconductor wafer broken. After the heating treatment in the heat treatment apparatus 1 is stopped, an operator of the heat treatment apparatus 1 visually checks the inside of the chamber 6. Specifically, the operator moves the flash heating part 5 provided over the chamber 6, and then visually checks the inside of the chamber 6 through the upper chamber window 63.

The operator checks whether or not there is cracking of the semiconductor wafer W and a state of the cracking, in the chamber 6. While detecting cracking of the semiconductor wafer W, the crack detection sensor may cause erroneous detection (i.e., actually the semiconductor wafer W does not crack) in some cases. When the semiconductor wafer W does not crack, the operator restarts the operation of the heat treatment apparatus 1. On the other hand, when the semiconductor wafer W cracks, the operator checks a state of the cracking. Typically, when a semiconductor wafer W made of silicon cracks, there are cases of cracking into several large fragments (cleaving) and cracking into fine powder fragments (shuttering). The operator also checks how the semiconductor wafer W cracks.

Next, the thin line (bypass line 199) is opened by operation of the operator at time t2. At time t2, only the thin line is opened, and the thick line, the middle line, and the supply line are still closed. When the thin line is opened, the vacuum pump 191 exhausts gas from the inside of the chamber 6. At this time point, only the thin line is opened, so that an exhaust flow rate from the chamber 6 is smaller than the steady exhaust flow rate (exhaust flow rate during heating treatment of the semiconductor wafer W). Then, pressure inside the chamber 6 is gradually reduced by starting the exhaust through the thin line from time t2 without gas supply into the chamber 6 as shown in FIG. 10. After cracking of the semiconductor wafer W is detected at time t1 and all of the thick line, the middle line, the thin line and the supply line are closed, the pressure in the chamber 6 is kept constant until time t2 when the exhaust is started.

When the exhaust through the thin line is started, ammonia is discharged from the inside of the chamber 6. While broken fragments of the semiconductor wafer W are present in the chamber 6, gas is exhausted from the chamber 6 at an exhaust flow rate that is remarkably smaller than the steady exhaust flow rate, only through the thin line. As a result, no strong exhaust flow is formed in the chamber 6, so that such fragments are prevented from entering the gas exhaust pipe 88 from the chamber 6. Some fragments may enter the gas exhaust pipe 88, but the fragments are removed by the filter 93. That is, the exhaust is performed at an exhaust flow rate that does not allow the fragments of the semiconductor wafer W existing in the chamber 6 to pass through the filter 93. This enables fragments of the semiconductor wafer W to be prevented from being caught in the vacuum pump 191 to prevent failure of the vacuum pump 191.

At time t3 when pressure in the chamber 6 is reduced to atmospheric pressure P1 by exhausting an atmosphere in the chamber 6 through the thin line, operation of the operator or control of the controller 3 causes the middle line (bypass line 198) to be opened along with the thin line. The pressure gauge 180 measures pressure in the chamber 6. When the thin line and the middle line are opened, the exhaust flow rate from the chamber 6 increases more than that when only the thin line is opened (during a period from time t2 to time t3). The exhaust flow rate from the chamber 6 when the thin line and the middle line are opened after time t3 is also smaller than the steady exhaust flow rate. Then, pressure inside the chamber 6 is further reduced by starting exhaust through the thin line and the middle line from time t3 without gas supply into the chamber 6. The atmospheric pressure P1 is about 20 kPa, for example.

When the exhaust through the thin line and the middle line is performed, ammonia is further discharged from the inside of the chamber 6. After exhaust is performed at a smaller exhaust flow rate, the exhaust flow rate is increased. As a result, a large airflow change is prevented from occurring in the chamber 6 to minimize fragments of the semiconductor wafer W, entering the gas exhaust pipe 88. Small pieces of fragments entering the gas exhaust pipe 88 are removed by the filter 93. That is, the exhaust is performed at an exhaust flow rate that does not allow the fragments of the semiconductor wafer W existing in the chamber 6 to pass through the filter 93, even after time t3. This enables fragments of the semiconductor wafer W to be prevented from being caught in the vacuum pump 191.

At time t4 when pressure in the chamber 6 is reduced to atmospheric pressure P2 by further exhausting the atmosphere in the chamber 6 through the thin line and the middle line, operation of the operator or control of the controller 3 causes the thin line and the middle line to be closed. At the same time, the supply line is opened to supply nitrogen gas into the chamber 6 from the treatment gas supply source 85. When exhaust from the chamber 6 is stopped by closing all of the thick line, the middle line, and the thin line, nitrogen gas is supplied into the chamber 6 to restore pressure in the chamber 6 to the atmospheric pressure (about 101325 Pa). The atmospheric pressure P2 is about 100 Pa, for example.

When pressure in the chamber 6 is reduced to the atmospheric pressure P2, ammonia in the chamber 6 is discharged to a level causing no problem even with the chamber 6 opened. From this state, nitrogen gas is supplied into the chamber 6 to restore pressure in the chamber 6 to the atmospheric pressure, so that the ammonia atmosphere in the chamber 6 is replaced with a nitrogen atmosphere. The pressure reduction and the restoring pressure in the chamber 6 may be repeated multiple times. Then, after the pressure in the chamber 6 is restored to the atmospheric pressure and the atmosphere therein is replaced with a nitrogen atmosphere, the operator opens the chamber 6 to recover fragments of the broken semiconductor wafer W and clean the inside of the chamber 6.

In the present preferred embodiment, when flash heating causes a semiconductor wafer W to crack, supplying gas into the chamber 6 as well as exhausting gas therefrom is temporarily stopped. Then, after gas is exhausted from the chamber 6 at an exhaust flow rate smaller than the steady exhaust flow rate, nitrogen gas is supplied into the chamber 6 to restore pressure therein to the atmospheric pressure, and then the chamber 6 is opened to recover fragments of the semiconductor wafer W.

Exhausting gas from the chamber 6 at an exhaust flow rate smaller than the steady exhaust flow rate enables harmful ammonia to be discharged from the inside of the chamber 6 while fragments of the semiconductor wafer W are prevented from being drawn into the gas exhaust pipe 88. In other words, even when the semiconductor wafer W cracks in the chamber 6, gas in the chamber 6 can be exhausted while fragments of the semiconductor wafer W are prevented from being caught in the vacuum pump 191. Even if fragments of the semiconductor wafer W are slightly drawn into the gas exhaust pipe 88, the fragments are removed by the filter 93 to prevent the vacuum pump 191 from failing by catching the fragments.

When gas in the chamber 6 is exhausted after the semiconductor wafer W cracks, an exhaust flow rate is increased by exhausting gas through the thin line and the middle line after exhausting gas through only the thin line. It takes a considerably long time to reduce pressure in the chamber 6 to the atmospheric pressure P2 at a small exhaust flow rate through only thin line. Meanwhile, when gas is exhausted at a relatively large exhaust flow rate through the thin line and the middle line from the beginning, an airflow greatly changes in the chamber 6 to cause fragments of the broken semiconductor wafer to be easily drawn into the gas exhaust pipe 88. When the exhaust flow rate is increased after gas is exhausted from the chamber 6 at a small exhaust flow rate as in the present preferred embodiment, pressure in the chamber 6 can be reduced to the atmospheric pressure P2 in a relatively short time without causing an airflow to greatly change in the chamber 6. This enables gas in the chamber 6 to be exhausted in a relatively short time while effectively preventing fragments of the semiconductor wafer W from being caught in the vacuum pump 191.

While the preferred embodiments according to the present invention have been described hereinabove, various modifications of the present invention in addition to those described above may be made without departing from the scope and spirit of the invention. For example, the above preferred embodiment is configured such that when a semiconductor wafer W cracks, gas in the chamber 6 is exhausted through the thin line (bypass line 199) and the middle line (bypass line 198) after being exhausted through only the thin line, thereby increasing an exhaust flow rate. However, an exhaust mode when a wafer cracks is not limited to this. For example, gas may be exhausted through the thick line (bypass line 197), or may be exhausted through the thick line and the middle line. In addition, the exhaust flow rate is not always necessarily increased while gas is exhausted, so that pressure in the chamber 6 may be reduced to the atmospheric pressure P2 at a constant exhaust flow rate from an initial stage.

That is, when the semiconductor wafer W cracks, gas in the chamber 6 may be exhausted at an exhaust flow rate that is at least smaller than the steady exhaust flow rate. Specifically, one or two of the three lines including the thick line, the middle line, and the thin line, may be opened to exhaust gas from the chamber 6. It is preferable to determine which one of the thick line, the middle line, and the thin line is opened depending on a state of cracking of the semiconductor wafer W in the chamber 6. Specifically, it is preferable to exhaust gas at an exhaust flow rate that does not allow fragments of the semiconductor wafer W to pass through the filter 93. For example, when even a somewhat stronger exhaust flow formed in the chamber 6 may not cause fragments of the semiconductor wafer W, each of which is relatively large, to be drawn into the gas exhaust pipe 88, ammonia can be quickly discharged by exhausting gas from the chamber 6 at a relatively large exhaust flow rate (e.g., the thick line and the middle line are opened). Conversely, when fragments of the semiconductor wafer W, each of which is comparatively small, may be easily drawn into the gas exhaust pipe 88, it is preferable to exhaust gas from the chamber 6 at a relatively small exhaust flow rate (e.g., only the thin line is opened).

While the above preferred embodiment is configured such that an exhaust flow rate from the chamber 6 is adjusted by a combination of opening or closing of the three lines including the thick line, the middle line, and the thin line, the present invention is not limited to this. The flow control valve 196 may adjust an exhaust flow rate. That is, when the semiconductor wafer W cracks, gas may be exhausted from the chamber 6 at an exhaust flow rate smaller than the steady exhaust flow rate, adjusted by the flow control valve 196, with all of the thick line, the middle line, and the thin line, opened. Using the flow control valve 196 enables an exhaust flow rate to be adjusted more finely.

Although in the above preferred embodiment, the filter 93 for removing fragments is provided in the gas exhaust pipe 88, the filter 93 is not necessarily an indispensable element. Even when the filter 93 is not provided, exhausting gas from the chamber 6 at an exhaust flow rate smaller than the steady exhaust flow rate enables fragments of the semiconductor wafer W to be prevented from being caught in the vacuum pump 191. Typically, the vacuum pump 191 is designed to have no problem even if some fine dust is sucked. Thus, if relatively large fragments of the semiconductor wafer W can be prevented from being caught in the vacuum pump 191 by exhausting gas from the chamber 6 at an exhaust flow rate smaller than the steady exhaust flow rate, the vacuum pump 191 is prevented from failing even with some powdery fragments sucked into the vacuum pump 191.

Although in the above preferred embodiment, an atmosphere of ammonia is formed in the chamber 6 during heating treatment of the semiconductor wafer W, the technique according to the present invention can be suitably applied even to an atmosphere formed of another reactive gas such as hydrogen, nitric oxide, nitrous oxide, nitrogen dioxide, or the like, in the chamber 6. When the semiconductor wafer W cracks in the chamber 6 in which an atmosphere of reactive gas is formed, exhausting gas from the chamber 6 at an exhaust flow rate smaller than the steady exhaust flow rate enables the harmful reactive gas to be discharged from the inside of the chamber 6 while preventing fragments of the semiconductor wafer W from being caught in the vacuum pump 191.

In addition, even when an atmosphere of reactive gas is not formed in the chamber 6 (e.g., when a nitrogen atmosphere is formed in the chamber 6), the technique according to the present invention is applicable. When the semiconductor wafer W cracks in chamber 6 of a nitrogen atmosphere, exhausting gas from the chamber 6 at an exhaust flow rate smaller than the steady exhaust flow rate enables only fine powdery fragments to be discharged from the chamber 6 without drawing relatively large fragments of the semiconductor wafer W into the exhaust pipe 88. This enables the fragments of the semiconductor wafer W to be easily collected when the chamber 6 is opened.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to apply assist heating to the semiconductor wafer W. The present invention, however, is not limited to this. In place of the halogen lamps HL, discharge type arc lamps (e.g., xenon arc lamps) may be used as continuous lighting lamps to apply assist heating to the semiconductor wafer W.

A substrate to be treated by the heat treatment apparatus 1 is not limited to a semiconductor wafer, and may be a glass substrate to be used for a flat panel display such as a liquid crystal display device, and a substrate for a solar cell.

In addition, the heat treatment apparatus 1 is not limited to a flash lamp annealer, and may be a single-wafer type lamp annealer using halogen lamps, or an apparatus including a heat source other than flash lamps, such as a laser annealer. In particular, the technique according to the present invention can be suitably applied to an apparatus in which a semiconductor wafer may crack during heating treatment.

While the invention has been shown and described in detail, the foregoing description is in all aspects illustrative and not restrictive. It is therefore understood that numerous modifications and variations can be devised without departing from the scope of the invention.

What is claimed is:
1. An exhaust method of a heat treatment apparatus that applies heating treatment to a substrate in a chamber, the exhaust method comprising the steps of:
  (a) supplying a predetermined treatment gas into said chamber housing a substrate to apply heating treatment to said substrate while a vacuum pump exhausts gas from said chamber at a first exhaust flow rate;
  (b) stopping supply of said treatment gas into said chamber and exhaust from said chamber when cracking of said substrate during the heating treatment in said chamber is detected;
  (c) reducing pressure in said chamber after said step (b) by exhausting gas from said chamber at a second exhaust flow rate smaller than said first exhaust flow rate by using said vacuum pump; and
  (d) supplying an inert gas into said chamber to restore the pressure in said chamber to atmospheric pressure after the pressure in said chamber is reduced to a predetermined pressure.

2. The exhaust method of the heat treatment apparatus according to claim 1, wherein
an exhaust flow rate from said chamber is increased within a range smaller than said first exhaust flow rate, in said step (c).

3. The exhaust method of the heat treatment apparatus according to claim 2, wherein
a filter is provided in an exhaust line communicatively connecting said vacuum pump and said chamber.

4. The exhaust method of the heat treatment apparatus according to claim 3, wherein
said exhaust line branches into a plurality of bypass lines each having a different diameter, and
the exhaust flow rate from said chamber is adjusted by opening and closing each of the plurality of bypass lines.

5. The exhaust method of the heat treatment apparatus according to claim 1, wherein
a reactive gas is supplied into said chamber in said step (a).

6. The exhaust method of the heat treatment apparatus according to claim 1, wherein
the heating treatment is applied to said substrate by emitting a flash of light to said substrate using a flash lamp in said step (a).

* * * * *

UNITED STATES PATENT AND TRADEMARK OFFICE
CERTIFICATE OF CORRECTION

PATENT NO. : 10,446,415 B2  
APPLICATION NO. : 16/007088  
DATED : October 15, 2019  
INVENTOR(S) : Oma Nakajima et al.

Page 1 of 1

It is certified that error appears in the above-identified patent and that said Letters Patent is hereby corrected as shown below:

On the Title Page

Inventors (72) location should read as follows:  
(72) Inventors: Oma Nakajima, Kyoto (JP);  
　　　　　　　Mao Omori, Kyoto (JP)

Signed and Sealed this  
Nineteenth Day of November, 2019

Andrei Iancu  
*Director of the United States Patent and Trademark Office*